(12) United States Patent
Suttles et al.

(10) Patent No.: US 11,384,928 B2
(45) Date of Patent: Jul. 12, 2022

(54) INTERCONNECTION SYSTEM FOR LIGHTING FIXTURES

(71) Applicant: ABL IP Holding LLC, Atlanta, GA (US)

(72) Inventors: Benjamin M. Suttles, McDonough, GA (US); Patrick M. Tweel, Atlanta, GA (US); Nicholas A. Ratliff, Crawfordsville, IN (US); Elías Aurelio Romero Saldívar, Nuevo León (MX); Theodore R. Blumstein, Burford, GA (US)

(73) Assignee: ABL IP HOLDING LLC, Atlanta, GA (US)

( * ) Notice: Subject to any disclaimer, the term of this patent is extended or adjusted under 35 U.S.C. 154(b) by 0 days.

(21) Appl. No.: 15/930,792

(22) Filed: May 13, 2020

(65) Prior Publication Data

US 2020/0363048 A1 Nov. 19, 2020

Related U.S. Application Data

(60) Provisional application No. 62/849,419, filed on May 17, 2019.

(51) Int. Cl.
*F21V 23/00* (2015.01)
*F21V 23/06* (2006.01)
(Continued)

(52) U.S. Cl.
CPC .............. *F21V 23/008* (2013.01); *F21S 8/06* (2013.01); *F21V 23/06* (2013.01); *H05B 47/10* (2020.01);
(Continued)

(58) Field of Classification Search
CPC ........ F21K 9/238; F21K 9/278; F21V 17/164; F21V 21/088; F21V 23/007–009;
(Continued)

(56) References Cited

U.S. PATENT DOCUMENTS

| 4,245,874 A | 1/1981 | Bishop |
| 5,688,035 A | 11/1997 | Kasihima et al. |

(Continued)

OTHER PUBLICATIONS

"Knife Edge Wall and Surface Mount", Pose™, Available online at: www.axislighting.com, Oct. 4, 2019, 4 pages.
(Continued)

*Primary Examiner* — Rajarshi Chakraborty
*Assistant Examiner* — Steven Y Horikoshi
(74) *Attorney, Agent, or Firm* — Kilpatrick Townsend & Stockton LLP

(57) ABSTRACT

A lighting fixture includes a bus printed circuit board that receives power from an external source. The bus printed circuit board has traces that route the power to a set of exposed pads, and also has mechanical features for receiving an electronic device. The lighting fixture further includes a set of one or more drivers, having mechanical features for engaging the mechanical features of the bus printed circuit board to mechanically mount the driver to the bus printed circuit board. Each of the set of one or more drivers further includes a set of spring contacts positioned to engage at least some of the exposed pads of the bus printed circuit board when the driver is mounted to the bus printed circuit board, to supply power to the driver. The lighting fixture further includes one or more light sources driven by the one or more drivers.

16 Claims, 7 Drawing Sheets

(51) Int. Cl.
*F21S 8/06* (2006.01)
*H05K 1/18* (2006.01)
*H05K 1/14* (2006.01)
*H05B 47/10* (2020.01)
*F21Y 103/10* (2016.01)
*F21V 21/005* (2006.01)
*F21Y 115/10* (2016.01)

(52) U.S. Cl.
CPC ............ *H05K 1/142* (2013.01); *H05K 1/181* (2013.01); *F21V 21/005* (2013.01); *F21Y 2103/10* (2016.08); *F21Y 2115/10* (2016.08); *H05K 2201/10106* (2013.01); *H05K 2201/10522* (2013.01); *H05K 2201/209* (2013.01)

(58) Field of Classification Search
CPC ........ F21V 23/023; F21V 23/026; F21S 4/28; F21S 2/005; F21S 8/06; F21S 8/061; F21S 8/063; F21S 8/068; H05K 2201/209
See application file for complete search history.

(56) References Cited

U.S. PATENT DOCUMENTS

| | | | |
|---|---|---|---|
| 5,848,837 A * | 12/1998 | Gustafson | ............... F21V 31/04 362/235 |
| 6,161,939 A | 12/2000 | Bansbach | |
| 6,392,342 B1 * | 5/2002 | Parikka | .................. G02B 6/003 257/687 |
| 6,486,790 B1 | 11/2002 | Perlo et al. | |
| 6,827,456 B2 | 12/2004 | Parker et al. | |
| 6,945,668 B1 | 9/2005 | Orlov et al. | |
| 7,108,414 B2 | 9/2006 | McCollum et al. | |
| 8,029,708 B2 | 10/2011 | Parker et al. | |
| 8,052,307 B2 | 11/2011 | Bak et al. | |
| 8,092,063 B2 | 1/2012 | Isoda | |
| 8,152,352 B2 | 4/2012 | Richardson | |
| 8,498,505 B2 | 7/2013 | Moore et al. | |
| 8,721,152 B2 | 5/2014 | Coleman et al. | |
| 8,783,898 B2 | 7/2014 | Coleman et al. | |
| 8,794,812 B2 | 8/2014 | Coleman et al. | |
| 8,814,410 B2 | 8/2014 | McCollum et al. | |
| 8,827,531 B2 | 9/2014 | Richardson et al. | |
| 8,899,813 B2 | 12/2014 | McCollum et al. | |
| 9,170,364 B2 | 10/2015 | Ezell et al. | |
| 9,316,780 B2 | 4/2016 | Ezell | |
| 9,368,853 B2 | 6/2016 | Kroening et al. | |
| 9,383,496 B2 | 7/2016 | Parker et al. | |
| 9,563,006 B2 | 2/2017 | Ballard et al. | |
| 9,563,007 B2 | 2/2017 | McCollum et al. | |
| 9,703,031 B2 | 7/2017 | Sahlhoff et al. | |
| 9,707,641 B2 | 7/2017 | McCollum et al. | |
| 10,267,504 B2 | 4/2019 | Frederiksen | |
| 10,544,906 B1 * | 1/2020 | Openiano | ............... F21K 9/232 |
| 2006/0044824 A1 | 3/2006 | Chen | |
| 2007/0285941 A1 | 12/2007 | Ishihara et al. | |
| 2008/0089093 A1 | 4/2008 | Miller et al. | |
| 2008/0239753 A1 | 10/2008 | Parker et al. | |
| 2010/0296025 A1 | 11/2010 | Gourlay | |
| 2011/0182084 A1 * | 7/2011 | Tomlinson | ........... G02B 6/0036 362/555 |
| 2011/0285292 A1 * | 11/2011 | Mollnow | ............... F21V 29/717 315/113 |
| 2011/0317421 A1 | 12/2011 | So | |
| 2012/0262940 A1 * | 10/2012 | Miyairi | ............. G02F 1/133621 362/602 |
| 2013/0010453 A1 * | 1/2013 | Mahowald | ............... F21V 13/08 362/84 |
| 2015/0160395 A1 | 6/2015 | Sahlhoff et al. | |
| 2015/0176823 A1 * | 6/2015 | Leshniak | ............... F21V 29/777 362/235 |
| 2016/0033704 A1 | 2/2016 | Sahlhoff et al. | |
| 2016/0033712 A1 | 2/2016 | Sahlhoff et al. | |
| 2016/0138789 A1 * | 5/2016 | Brown | ................ F21V 23/0442 362/95 |
| 2017/0351475 A1 * | 12/2017 | Meersman | ............ G06F 3/1446 |
| 2018/0172257 A1 * | 6/2018 | Hierzer | .................... F21V 5/043 |
| 2019/0191525 A1 * | 6/2019 | Goldstein | ............. H05B 45/10 |
| 2019/0191534 A1 * | 6/2019 | De Bruycker | ......... H05B 47/19 |
| 2019/0264882 A1 * | 8/2019 | Gomez Martinez | .... F21S 8/043 |

OTHER PUBLICATIONS

U.S. Appl. No. 16/691,515, Non-Final Office Action dated Apr. 7, 2021, 14 pages.
U.S. Appl. No. 16/691,515, Advisory Action, dated Dec. 7, 2021, 4 pages.
U.S. Appl. No. 16/691,515, Notice of Allowance, dated Jan. 20, 2022, 9 pages.

\* cited by examiner

INTERCONNECTION SYSTEM FOR LIGHTING FIXTURES

BACKGROUND OF THE INVENTION

This application claims the benefit of U.S. Provisional Patent Application No. 62/849,419, filed May 17, 2019 and titled "Interconnection System for Lighting Fixtures", the entire disclosure of which is hereby incorporated by reference herein for all purposes.

Light fixtures are available in a wide variety of types, sizes, and configurations. A common aspect of different kinds of light fixtures is the need to route power to the light engines. Previous fixtures used individual wires that were often routed and interconnected by hand. This process was time consuming and error-prone. In addition, modern light fixtures may be digitally controllable, may include sensors such as room occupancy sensors, and may include wireless communication interfaces. These additional features require that even more electrical connections be made, further exacerbating traditional manufacturing difficulties.

BRIEF SUMMARY OF THE INVENTION

The terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings, and each claim.

According to one aspect, a lighting fixture comprises a bus printed circuit board that receives power from an external power source. The bus printed circuit board has traces that route the power to a set of exposed pads on a surface of the bus printed circuit board, and the bus printed circuit board also has mechanical features for receiving an electronic device. The lighting fixture further comprises a set of one or more drivers, each of the set of one or more drivers having mechanical features for engaging the mechanical features of the bus printed circuit board to mechanically mount the driver to the bus printed circuit board. Each of the set of one or more drivers further comprises a set of spring contacts positioned to engage at least some of the exposed pads of the bus printed circuit board when the driver is mounted to the bus printed circuit board, to supply power to the driver. The lighting fixture further comprises one or more light sources driven by the one or more drivers.

According to another aspect, a method of configuring a light fixture comprises obtaining one or more programmable drivers for use in the light fixture, and receiving configuration information for the light fixture. The configuration information specifies at least one behavior or setting for the one or more programmable drivers. The method further comprises placing the one or more programmable drivers into a programming fixture, and parsing the configuration information to determine configuration instructions necessary to program the one or more programmable drivers in accordance with the configuration information. The method further comprises providing the configuration instructions to the one or more programmable drivers through the programming fixture, to program the one or more programmable drivers, and transferring the one or more programmed drivers to the light fixture.

DETAILED DESCRIPTION OF THE INVENTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Figure 1:
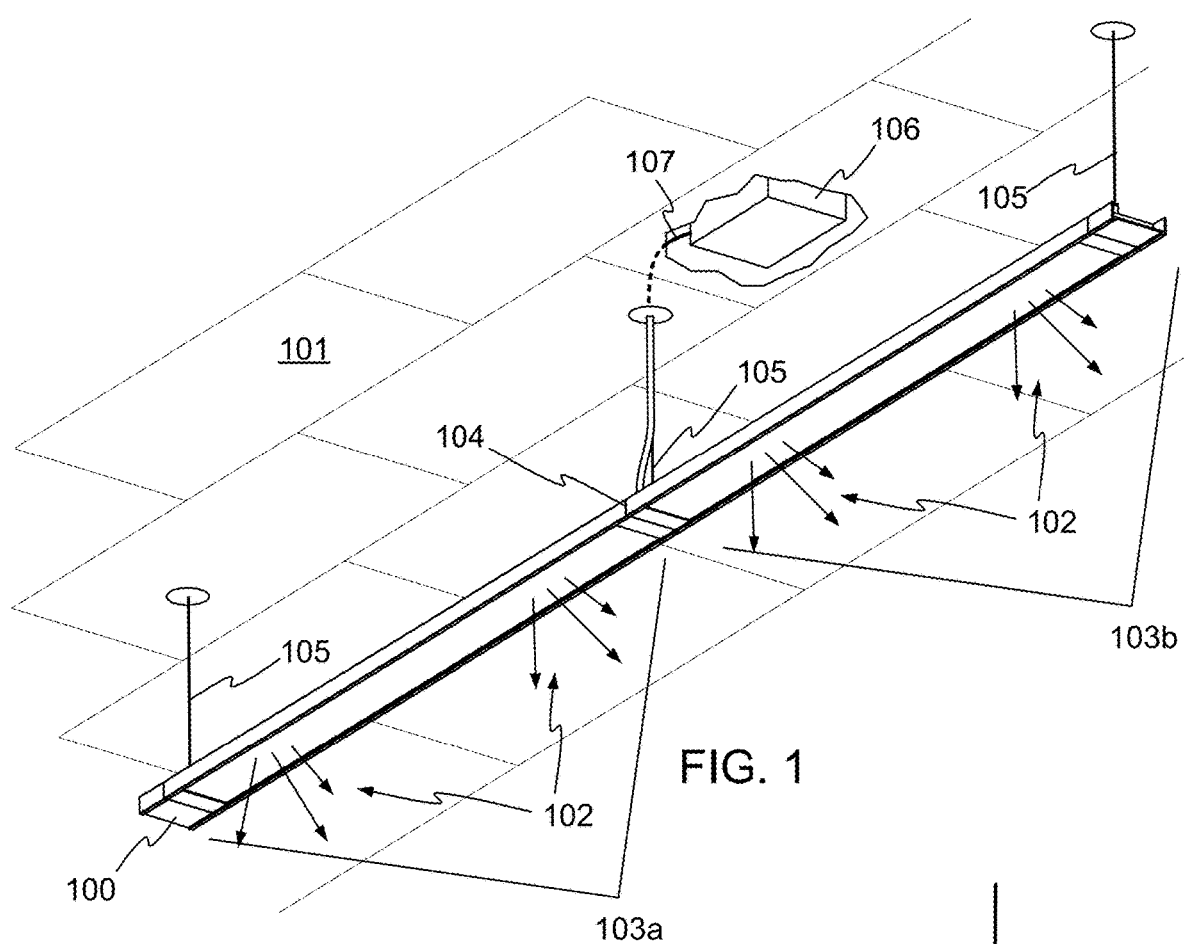
FIG. 1 is a lower oblique view of a light fixture in accordance with embodiments of the invention.

FIG. 1 illustrates a lower oblique view of a lighting fixture 100 in accordance with embodiments of the invention. It will be understood, however, that the invention is not limited to use with the particular lighting fixtures illustrated.

The lighting fixture 100 is suspended from a ceiling 101 by hangers 105, which may be cables, chains, rods, or other suitable hangers. The lighting fixture 100 directs downlight 102 downward into a room. The lighting fixture 100 includes two modular segments 103a and 103b, which abut at joint 104. Fixtures of any workable length may be constructed using more than two sections.

In some embodiments, the lighting fixture 100 operates on direct current (DC) power supplied by a transformer 106, mounted within the ceiling 101 or at another remote location. In this case, a single transformer 106 may supply DC power to a number of modular segments, such as the segments 103a and 103b, through a single power connection 107 from the transformer 106. The voltage of the DC power produced by the transformer 106 is preferably less than 60V, for example 55V-57V, to avoid the need for special enclosures and the like required by regulation for higher voltages. In other embodiments, a lighting fixture may operate on alternating current (AC) power. In still other embodiments, multiple transformers may be provided, distributed throughout the system in any workable manner. However, the arrangement of FIG. 1 may have the advantage that only a single transformer is needed, and is not visible to occupants of the room. And because the transformer 106 is mounted in the ceiling 101, remotely from the segments 103*a* and 103*b*, the hangers 105 do not need to support the weight of the transformer 106.

For the purposes of this disclosure, the term "transformer" encompasses a device that increases or decreases the voltage of AC power, and also encompasses a device that receives AC power and produces DC power.

In addition, terms such as "upper, "lower,", "top,", and "bottom" refer only to the orientation of the examples in the figures. Light fixtures embodying the invention may be used in other orientations, for example and orientation in which an "top" surface as shown in the figures faces downward in practice.

Figure 2:
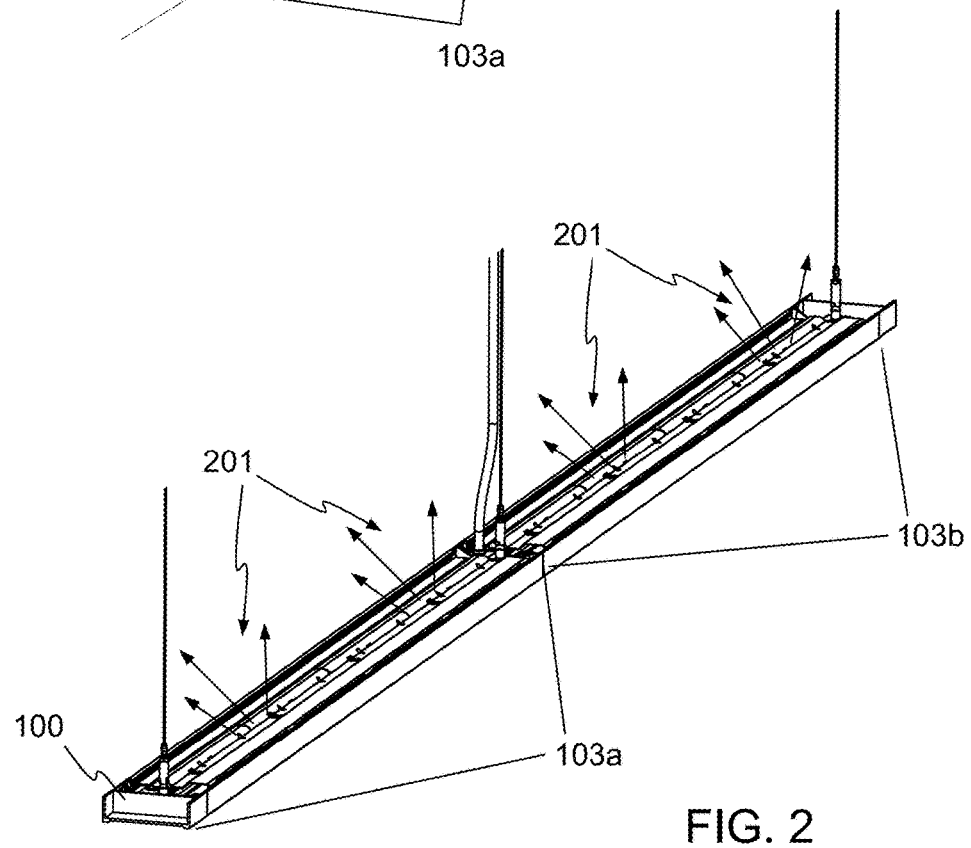
FIG. 2 illustrates an upper oblique view of the light fixture of FIG. 1, in accordance with embodiments of the invention.

FIG. 2 illustrates an upper oblique view of the light fixture 100, in accordance with embodiments of the invention. As is visible in FIG. 2, the light fixture 100 may also be able to produce uplight 201, which may reflect from the ceiling 101, providing indirect lighting to the room in which the lighting fixture 100 is installed.

In some embodiments, the lighting fixture 100 may have separate light sources and drivers for producing downlight 102 and uplight 201. The separate light sources may be similar, or may be different, for example differing in light source type, color, or other aspects. Either or both of downlight 102 and uplight 201 may be controllable in brightness, color, or other characteristics.

Embodiments of the invention provide a system for electrically interconnecting components in a lighting fixture efficiently and with reduced opportunity for manufacturing error.

Figure 3:
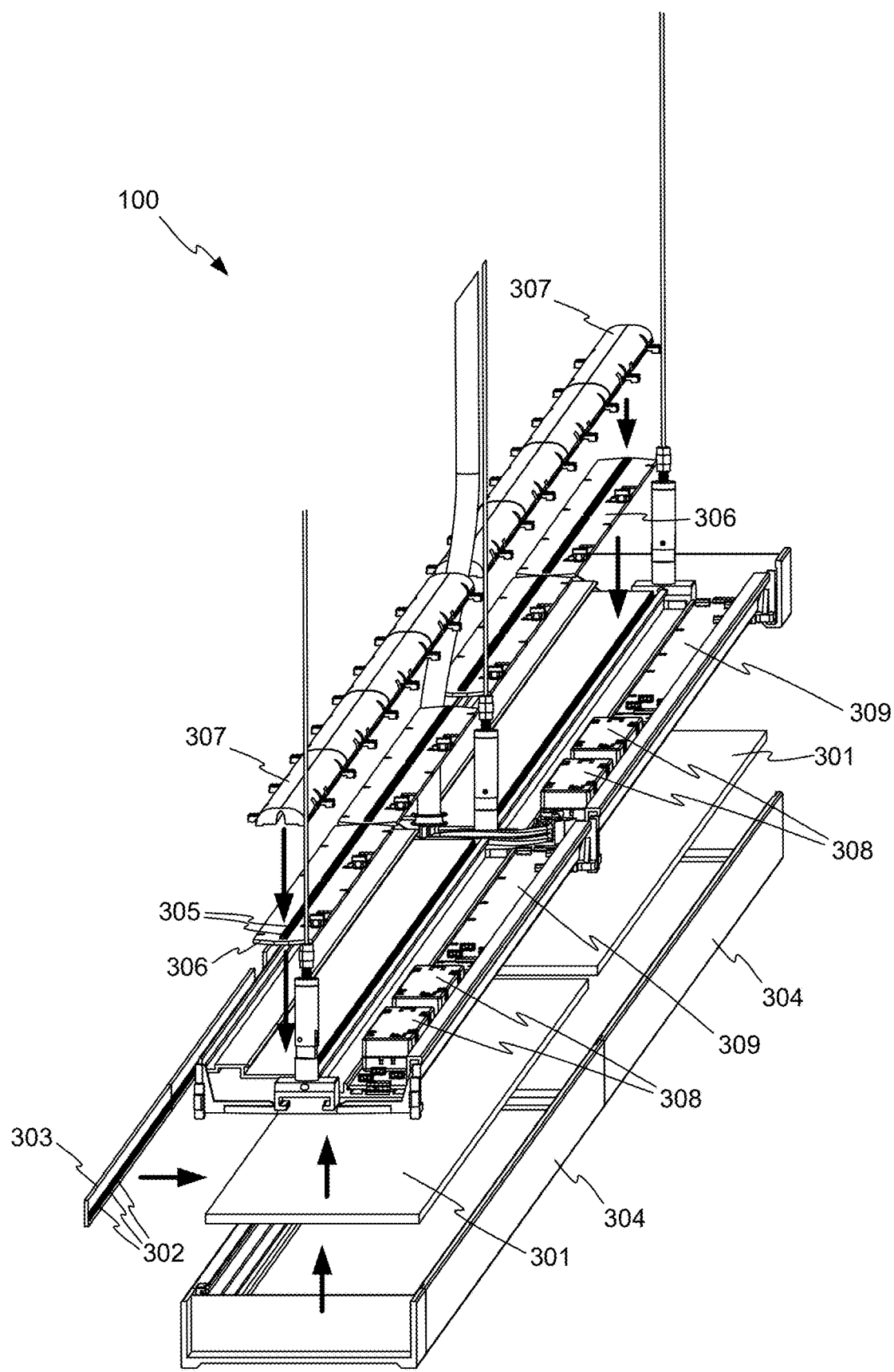
FIG. 3 shows a partially-exploded upper oblique view of the light fixture of FIG. 1, according to embodiments of the invention.

FIG. 3 shows a partially-exploded upper oblique view of the light fixture 100, according to embodiments of the invention, and with some enclosure parts and wiring connections removed to reveal internal details.

In the example fixture 100, downlight 102 is provided by light guide plates 301, which are edge-lit by downlight light emitting diodes (LEDs) 302 mounted on one or more downlight printed circuit boards (PCBs) 303. The light guide plates 301 may be, for example, clear panels made of acrylic, PMMA, or another suitable material. Each of the light guide plates 301 receives light from the downlight LEDs 302 through one edge of the light guide plate 301. The light propagates within the light guide plates 301 by total internal reflection until it encounters extraction features that redirect the light out the bottom of the light guide plates 301. For example, the top surfaces of the light guide plates may be roughened or textured in a pattern that extracts light uniformly from the bottom surfaces of the light guide plates 301. A reflector (not shown) may be placed on top of each of the light guide plates 301, to redirect downward any light scattered upward by the extraction features. Each of the light guide plates 301 may be surrounded by a frame 304, which may also provide a rigid housing for a segment of the light fixture 100.

In this example, uplight 201 is provided by a number of uplight LEDs 305 mounted to one or more uplight PCBs 306. Lenses 307 may be placed over the uplight LEDs to direct the uplight 201 into a desired pattern.

Power is supplied to the downlight LEDs 302 and uplight LEDs 305 by a number of drivers 308, which are mounted to one or more bus PCBs 309.

The drivers 308 and the various printed circuit boards of the light fixture 100 are cooperatively configured to facilitate the efficient and reliable assembly of the light fixture 100.

Figure 4:
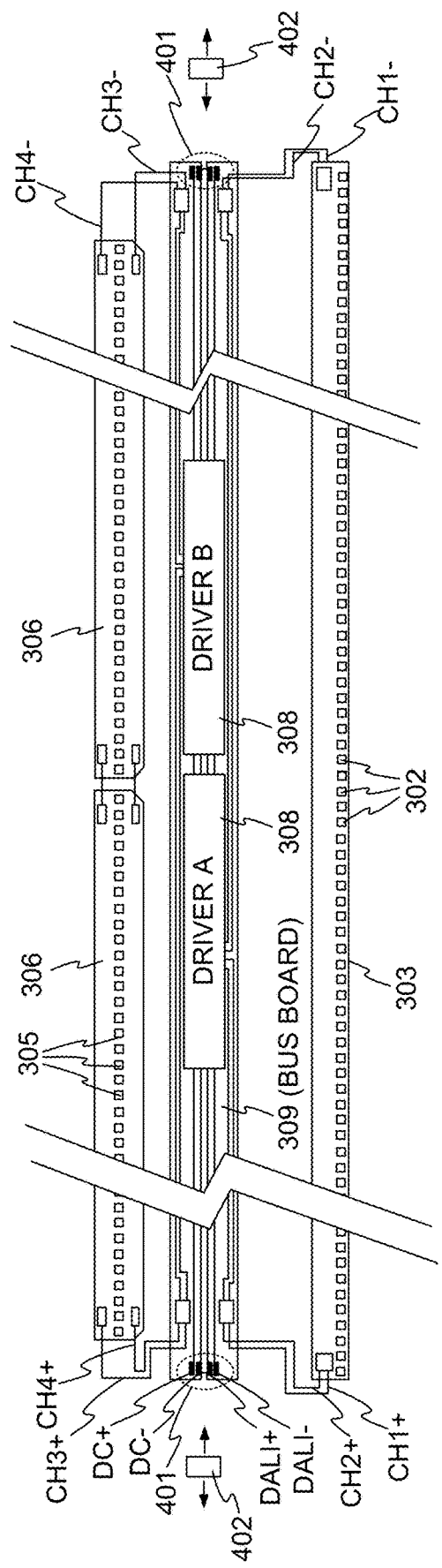
FIG. 4 illustrates the electrical architecture of a portion of the light fixture of FIG. 1, in accordance with embodiments of the invention.

FIG. 4 illustrates the electrical architecture of a portion of the light fixture 100, in accordance with embodiments of the invention. Bus PCB 309 includes four conductive pads 401 at each end. The pads on the opposite ends of the bus PCB 309 are connected by traces running the length of the bus PCB 309, allowing multiple bus PCBs 309 to be connected using edge card connectors 402. The traces running between the pads 401 at the two ends of the bus PCB 309 may take any workable path, and need not be straight.

The drivers 308 preferably snap onto the bus PCB 309, making electrical connection via additional conductive pads described in more detail below. The drivers 308 receive DC power from the transformer 106 through power connection 107 and through the bus board 309, The drivers 308 preferably produce controlled current that is routed via other traces and connectors to downlight PCB 303 and the uplight PCBs 306, to illuminate the downlight LEDs 32 and the uplight LEDs 305.

In addition, the bus board 309 receives signals from a control system and routs the control signals to the drivers 308. The control signals may be, for example, signals implementing a standard or propriety protocol for communicating with the drivers 308. In some embodiments, the system may implement the standardized Digital Addressable Lighting Interface (DALI), described by technical standards IEC 62836 and IEC 60929, and certified by the Digital Illumination Interface Alliance. DALI allows sending commands to lighting equipment and receiving data from sensors included in the lighting equipment. In other embodiments, any other suitable protocol and interface may be used. The DALI (or other protocol) signals are also carried by traces through the bus board 309 so that additional bus boards can be connected together for extended, fully-controllable light fixtures.

Each of the drivers 308 may implement one or more lighting "channels." For example, half of the uplight LEDs 305 may be run from one channel of one of the drivers 308, and the other half may be run from a second channel of the same driver 308. This capability allows additional control of the character of the light produced by the uplight LEDs 305. For example, half of the uplight LEDs may have one color characteristic, and the other half may have a different color characteristic, and the relative brightness of the two sets of uplight LEDs 305 can be adjusted to change the apparent color temperature of the uplight 201.

Similarly, the downlight LEDs 302 may be grouped into two groups that are driven by different channels of another one of the drivers 308. With two drivers 308 as shown in FIG. 4, a total of four channels are available.

In other embodiments, only one, or more than two channels may be implemented in a driver. For example, in an implementation with three channels, the set of LEDs may include a group of red LEDs, a group of green LEDs, and a group of blue LEDs, all driven by different respective channels. It may be possible to generate light of nearly any arbitrary color within the gamut made possible by the particular LEDs used, by adjusting the relative brightness of the red, green, and blue LEDs.

Each of the drivers 308 takes power from the through-going traces on the bus board 309, and delivers controlled current to a different set of traces. The current is supplied to a number of connectors, to which the downlight PCB 303 and the uplight PCBs 306 are connected.

Figure 5:
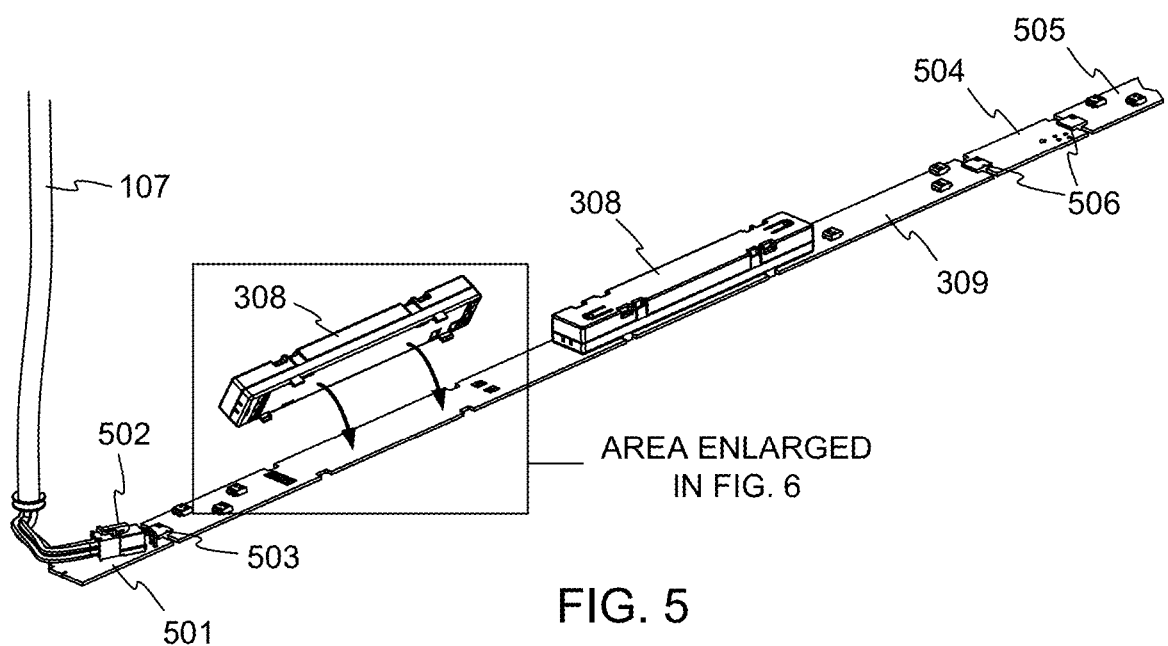
FIG. 5 shows some aspects of the electrical interconnections in the light fixture of FIG. 1, in accordance with embodiments of the invention.

FIG. 5 shows some aspects of the electrical interconnections in the light fixture 100, in accordance with embodiments of the invention. The power connect 107 brings a number of wires to a jumper board 501. In this example, four wires are present, carrying DC power and a DALI interface, but in other embodiments, different numbers of wires may be present. The wires connect to the jumper board 501 via a suitable connector 502 and a mating connector on the jumper board 501. The jumper board 501 is connected to the bus board 309 via an edge card connector 503. An additional jumper board 504 joins the bus board 309 to another bus board 505, via additional edge card connectors 506. The second jumper board 504 may not have a connector for receiving power connection 107. In this way, any workable number of bus boards can be joined to make a fixture of any workable length.

In other embodiments, adjacent bus boards may connect directly together, without the use of jumper boards. The adjacent bus boards may be connected using a dual-ended edge card connector, a wiring harness, or another suitable kind of connection.

Figure 6:
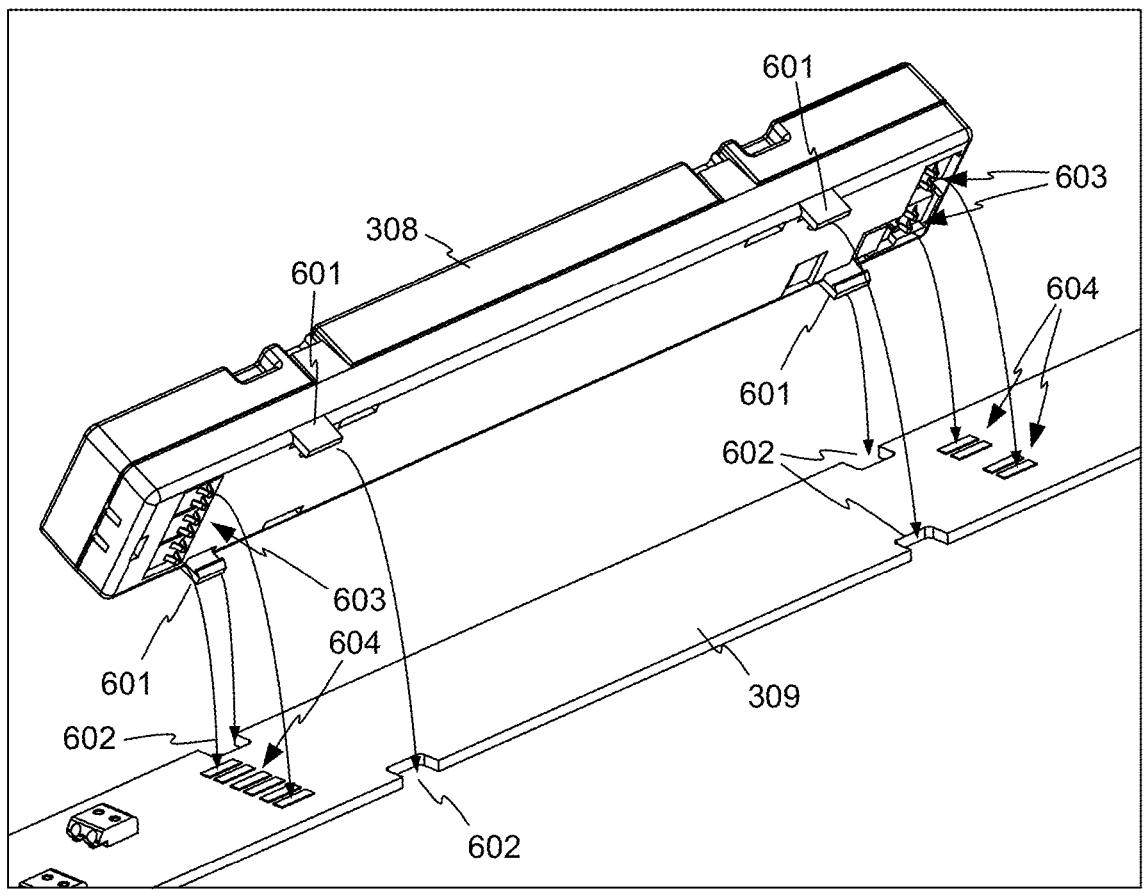
FIG. 6 shows the connection a driver to a bus board, in accordance with embodiments of the invention.

FIG. 6 shows the connection one of the drivers 308 to the bus board 309, in accordance with embodiments of the invention. The shell of the driver 308 may be made of a polymer such as ABS, polycarbonate, or another suitable polymer or blend of polymers. Hook-shaped snaps 601 are preferably molded into the shell of the driver 308, and are positioned to engage with notches 602 in the bus board 309, such that the driver 308 can snap securely to the bus board 309 with the hook-shaped snaps 601 engaging the underside of the bus board 309.

At the same time, a number of spring contacts 603 of the driver 308 mate with exposed pads 604 on the bus board 309. In this example, four of the spring contacts 603 a mate to traces connected to the pads 401 shown in FIG. 4. These four spring contacts 603 bring DC power to the driver 308, and also the communication interface such as DALI.

Another four of the spring contacts 603 are outputs of the driver 308, and mate with another four of the exposed pads 604. Two outputs are the positive and negative terminals for a first LED drive channel (CH1+ and CH1−+ in FIG. 4). Another two of the outputs are the positive and negative terminals for a second LED drive channel (CH2+ and CH2− in FIG. 4).

The last two spring contacts 603 mate with the remaining two exposed pads 604, and may be used by the driver 308 for intra-fixture communication. For example, the driver may implement a protocol such as LEDcode, which provides power and communication signals, and may be used to power and communicate with peripheral devices that may be present within the light fixture 100. Example peripheral devices include motion sensors, light sensors, humidity sensors, temperature sensors, carbon monoxide sensors, cameras, wireless communication modules such as Bluetooth® modules, and others.

While the driver 308 includes 10 spring contacts for a total of 10 input/output signals, other numbers of signals may be present in other embodiments, for example in a driver having only one drive channel, or a driver having three drive channels.

Figure 7:
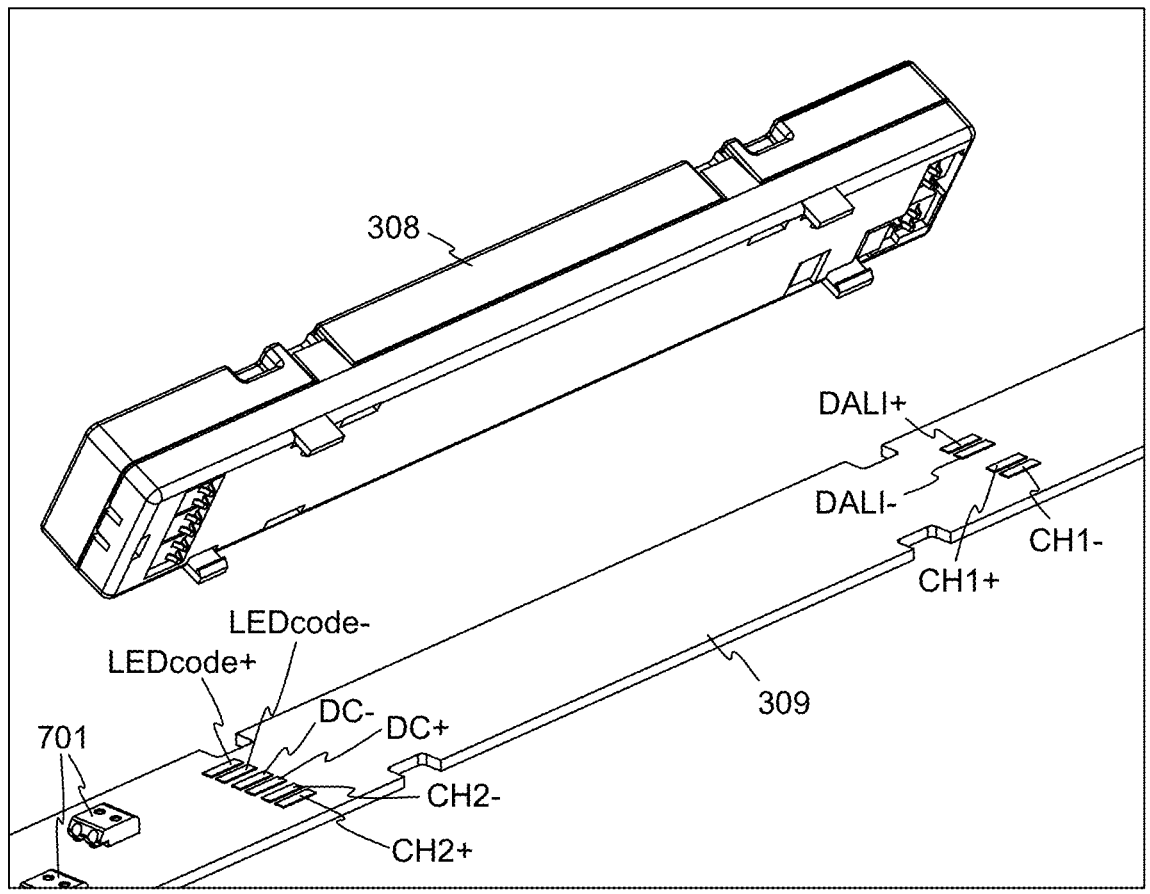
FIG. 7 shows one example arrangement of pads on the bus board of FIG. 6.

The exposed pads 604 may be arranged in any workable way. FIG. 7 illustrates one example arrangement of the exposed pads 604 for the 10 signals connected to one of the drivers 308. A similar arrangement may be used for the other driver 308 on the bus board 309, except that the outputs are supplied to two different LED channels (CH3 and CH4 in this example.) While the power outputs and LEDcode signals connect to other parts of the system via one or more connectors 701. Any suitable types of connectors may be used. For example, at least the DC power outputs (CH1+, CH1−, CH2+, CH2−) may be conveniently connected to an LED board such as the downlight PCB 303 via poke-in wire connectors. In other embodiments, any suitable multi-pin connectors may be used.

Because the drivers 308 simply snap onto the bus board 309, automatically making their electrical connections in the process, assembly of the light fixture 100 may be simplified, and may be less prone to error than in previous fixtures.

In other embodiments, the assembly of a light fixture may be further simplified. For example, the components of one or more of the drivers 308 may be integrated into the bus board itself, so that no separate driver need be installed on the bus board 309. In other embodiments, the functions of the bus board 309 and one or more of the other PCBs in the system may be combined. For example, the a single PCB may provide the function of the bus board 309, and may also carry the uplight LEDs 305 or the downlight LEDs 302. In other embodiments, a single PCB may function as a bus board, may carry LEDs, and may include integrated driver circuitry. Many configurations are possible.

While the bus board 309 is shown as an elongate, generally rectangular, rigid PCB, these are not requirements. In other embodiments, the bus board 309 may take any workable shape, for example L-shaped, square, curved, polygonal, round, elliptical, or another shape or combination of shapes. The bus board 309 also need not be rigid. A flexible circuit, for example including traces between layers of polyimide film, may be used, and may enable other fixture configurations, including configurations in which the bus board is not all in the same plane.

Figure 8:
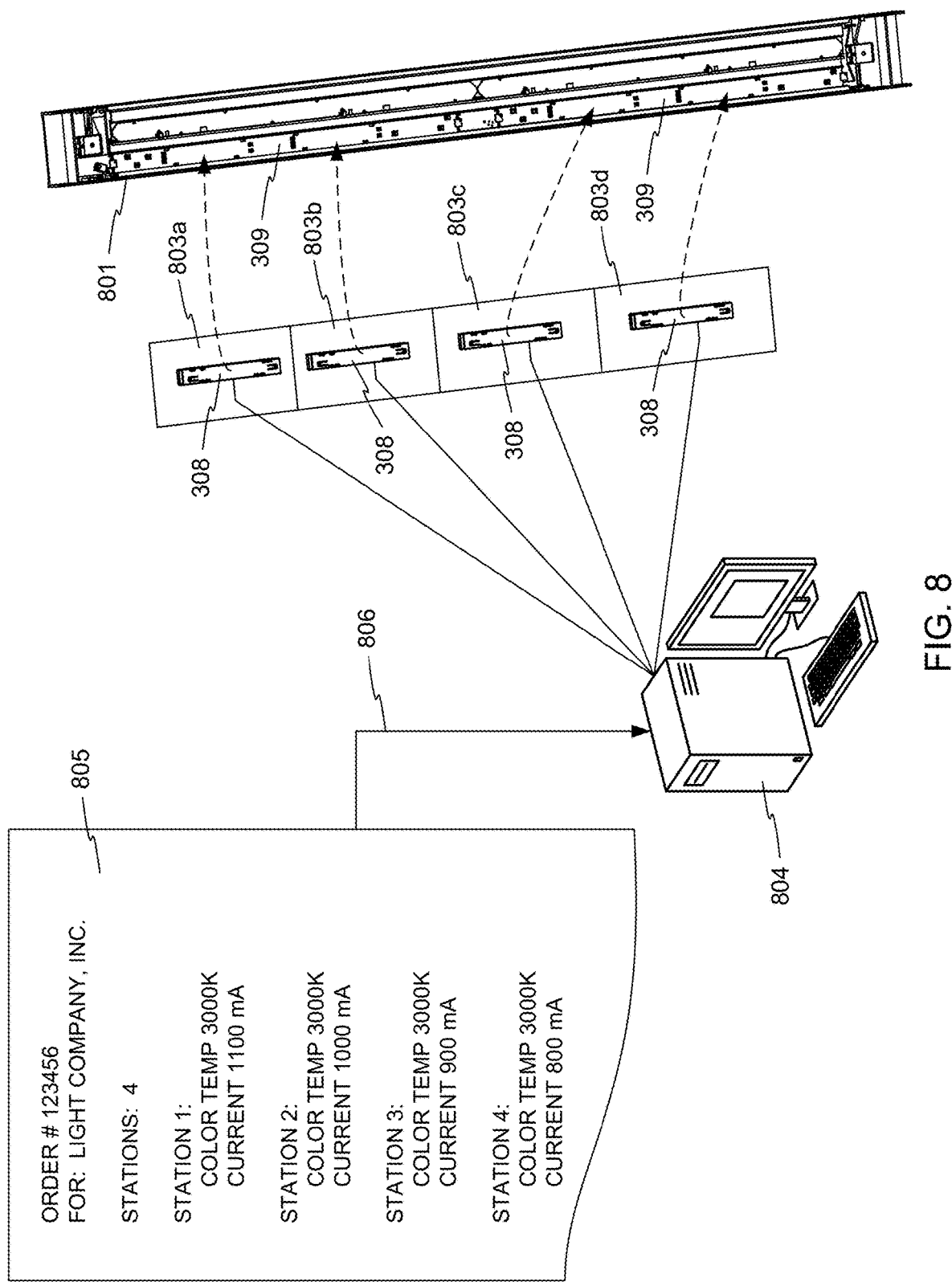
FIG. 8 illustrates a programming fixture and process, in accordance with embodiments of the invention.

FIG. 8 illustrates a programming fixture and process, in accordance with embodiments of the invention. A light fixture 801 may be similar to segment 103a or segment 103b of the light fixture 100 of FIG. 1. The light fixture 801 has positions for up to four drivers 308 to be mounted on two bus boards 309. The drivers 308 may be programmable for a variety of reasons. For example, each of the drivers 308 may be configured to produce light of a specific color temperature, by providing different amounts of current to different colored LEDs connected to two different channels of the driver 308. In another example, each of the drivers 308 may be configured to provide a specific amount of current to its LEDs in a "full on" state. In this way, light fixtures may be adapted to different usages. In some cases, different light fixtures or even different portions of a particular light fixture can be configured to be brighter or less bright than other fixtures or fixture portions. This may be desirable to accommodate particular room shapes, for example a room shape in which one light fixture necessarily lights a smaller portion of the room than another light fixture. In another example, each driver may be configurable to turn its respective LEDs on and off instantly, or to use a gradual transition for aesthetic effect. Other programmable aspects of the light fixture 800 may include a minimum dimming level, and a dimming curve that specifies whether dimming appears to be linear or non-linear.

Each of the drivers 308 may include a flash memory, electrically erasable programmable read only memory (EEPROM), or another kind of non-volatile memory to store its particular configuration.

In the system of FIG. 8, "blank" drivers are placed in a programming fixture 802. The programming fixture 802 has stations 803a-d for receiving the drivers. Each of the stations 803a-803d may have a set of contacts similar to those on the bus boards 309 for connecting to and communicating with the drivers 308. In other embodiments, each of the drivers may have a specialized programming interface. A combination of interfaces may be used if desired. The drivers 308 in the stations 803a-d are individually addressable by a computer system 804, so that each driver 308 can be uniquely programmed if desired. That is, one or more of the drivers 308 may be programmed differently than another driver 308. Of course, all of the drivers 308 in the programming fixture 802 can be programmed identically as well.

The computer system 804 may receive order information 805 from an outside source, for example from an order entry system connected to a network 806. The order information 805 preferably lists the configuration of the light fixture 801 as specified for a particular order for a particular customer. The order information 805 is preferably stored in a standardized format, so that the computer system 804 can parse the order information 805. The computer system then programs each of the drivers 308 by sending instructions individually to the stations 803a-803d. In other embodiments, the configuration information may be keyed into the computer system 804, or may be read from a printed order using a bar code reader, and RFID reader, or the like. Any suitable technique for providing the configuration information to the computer system 804 may be used.

Once the drivers 308 are programmed in the programming fixture 802, then the drivers 803 can be transferred to the corresponding mounting locations in the light fixture 801. The light fixture 801 thus takes on the exact configuration specified in the order information 805.

In other embodiments, at least some of the drivers 308 may each be programmed with a default "emergency" behavior, triggered by the detection of a loss of voltage in the control lines, for example DALI control lines. In some installations, light fixtures such as the light fixture 100 may have backup power, and may be able to produce light when power to the building is interrupted. However, the control lines such as DALI interface may not receive backup power, so that in the event of a building power interruption, no voltage may be present across the DALI (or other control) lines. This loss of control voltage gives each driver 308 the ability to detect when a building power interruption has occurred, even though the driver 308 may otherwise be receiving power via a backup system.

Once a loss of control voltage is detected by a driver 308, the driver may revert to a programmed emergency behavior. In one possible behavior, the driver 308 may immediately turn on some or all of its LEDs at a fixed power level. For example, the driver 308 may turn all of its LEDs on at maximum current, to provide light for a possible building evacuation. Or the driver 308 may turn on some or all of its LEDs at less than maximum current, so that light is produced but backup power is conserved, as compared with using maximum current. The reduced lighting level may be achieved by turning on all of the LEDs at less than full power, or by turning on fewer than all of the LEDs at full power, or by some combination of theses. In one possible arrangement, a light fixture may have multiple drivers 308, having differing emergency behaviors. In another possible behavior, a driver may turn on its LEDs to produce a predetermined color of light. In another example, a particular fixture may flash or blink when in its emergency state.

In another possible arrangement, the drivers of different light fixtures may be programmed with different emergency behaviors. For example, some of the light fixtures in the building may shut off when a loss of control power is detected, while others turn on (at full or reduced power) to mark an evacuation route, or to generally provide a nominal level of illumination while conserving power. The illumination level may be selected based on the capacity of the backup power system, so that illumination can be sustained for a time period required by local building codes. In another example, different fixtures in the building may produce different colors of light during loss of control power.

These capabilities are provided by including a detection circuit within at least some of the drivers 308, so that the drivers can detect the loss of control power, and by providing programming within the drivers to implement the desired emergency behavior. For example, drivers 308 may include microprocessors or other control circuitry programmed or configured to detect loss of control power, and to implement the proper emergency behavior.

It will be recognized that any workable combination of emergency behaviors may be implemented as well. For example, any combination of current level, light color, flashing or blinking, or other behaviors within or between fixtures, may be used.

Figure 9:
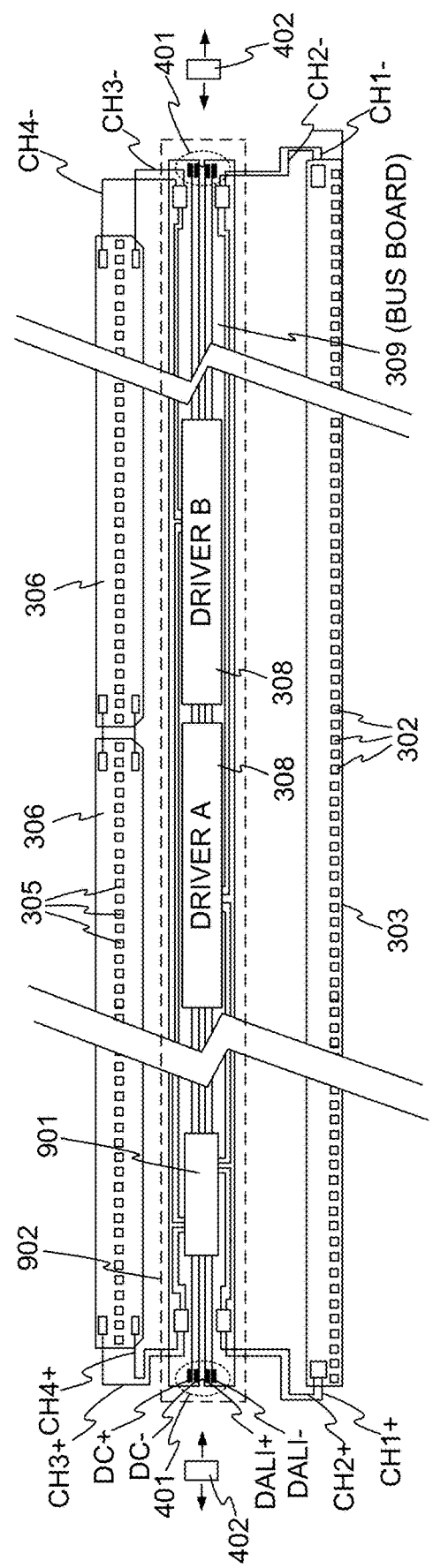
FIG. 9 illustrates the electrical architecture of a portion of a light fixture, in accordance with other embodiments of the invention.

FIG. 9 illustrates the electrical architecture of a portion of a light fixture 100, in accordance with other embodiments of the invention. The architecture of FIG. 9 is similar to the architecture shown in FIG. 4, but adds current limiting circuitry 901 on the bus board 309. Currently limiting circuitry 901 may attach to bus board in any suitable way. For example, the current limiting circuitry 901 may be housed on a module that snaps onto the bus board 309 similar to the way that drivers 308 attach, and may have spring contacts that make electrical connection to pads formed on the surface of the bus board 309. In other embodiments, the current limiting circuitry 901 may include electronic components such as integrated circuits and discrete electronic components soldered directly to the bus board 309. Any workable technique for mounting an connecting the current limiting circuitry 901 may be used.

In any event, the current limiting circuitry 901 intercepts current being supplied from the drivers 308 to the LEDs 302 and 305, and limits the current that can be supplied from the bus board 309 to the downlight and uplight PCBs 302 and 306, regardless of the current-supplying capability of the drivers 308. For example, the current limiting circuitry 901 may limit the current to a value such that the outputs of the current limiting circuitry comply with industry safety standards such as to be Class 2 circuitry under the National Electrical Code (NEC), or to meet the requirements of Underwriters Laboratories standard 60950 for limited power sources. For example, in the power ranges of interest for light fixtures, UL 60950 requires that to qualify as a limited power source, a power source must have a power output of no more than 100 VA, and must provide that power at a voltage of no more than 60V. These limits must be met even in the presence of any single point failure of the device.

A power source that meets the limited power source requirements of UL 60950 is not subject to stringent enclosure requirements, because a limited power source presents little risk of fire or electrical shock. However, a power source that exceeds these limits is subject to more stringent enclosure design requirements, to protect against fire risk and possibly shock hazards. Such an enclosure meeting these more stringent requirements may add cost to a light fixture.

It is therefore desirable to avoid circuitry that exceeds the regulatory limits, or at least to minimize the extent of such circuitry within the lighting fixture.

Referring to FIGS. 1 and 9, the transformer 106 preferably can provide power exceeding the limits of UL 60950 or NEC Class 2. For example, the transformer 106 may produce DC power at a voltage of about 57 volts, and may be able to supply up to 320 W of power. This power level is sufficient that several of the light fixtures 100 can be powered from a single transformer 106, for example up to 32 feet or more of light fixtures.

This means that the transformer 106 and any circuitry directly connected to it may not qualify as limited power equipment. For example, the bus boards 309 carry power and ground traces flowing directly from the transformer 106, and thus the bus boards 309 also would not qualify as a limited power source. The bus boards 309 may therefore be required to be housed in fire-protective enclosures, for example.

The drivers 308 may include current limiting circuitry, but if that current limiting circuitry has a single point of failure that could result in excess current flowing from the drivers 308, they also would not qualify as limited power sources. In that case, the bus boards 309, the drivers 308, and the LED boards 302 and 306 would all be subject to enhanced enclosure safety requirements. In particular, housing the LED boards 302 and 306 in an enhanced safety enclosure may add cost to the fixture, and may limit design choices for aesthetics and lighting efficiency.

With the addition of the current limiting circuitry 901, there is no longer a single point of failure, so as long as the output of the current limiting circuitry 901 is below the electrical limits (60V and 100 VA for UL 60950 e.g.), only the bus boards 309, drivers 308, and current limiting circuitry 901 need be housed in a fire-protective enclosure. That is, only the elements within dashed boundary 902 of FIG. 9 are subject to enhanced enclosure requirements. The enhanced enclosure may thus be kept small, and relatively inexpensive.

Because the LED boards 302 and 306 are not subject to higher power signals (absent a multi-point failure), the LED boards 302 and 306 can be outside any enhanced enclosure, and their aesthetics and lighting efficiency may not be significantly constrained by enclosure requirements.

It will be apparent to those skilled in the art that various modifications and variations can be made in the method and system of the present invention without departing from the spirit or scope of the invention. Thus, it is intended that the present invention include modifications and variations that are within the scope of the appended claims and their equivalents. It is to be understood that any workable combination of the features and capabilities disclosed herein is also considered to be disclosed.

What is claimed is:

1. A lighting fixture, comprising:
a bus printed circuit board configured to receive power from an external power source, wherein the bus printed circuit board comprises a first set of exposed pads, a second set of exposed pads and a third set of exposed pads on a surface of the bus printed circuit board, wherein the bus printed circuit board comprises first traces that route the power from the external source to the first set of exposed pads, wherein the bus printed circuit board is configured to receive communication signals from an external communication signal source, wherein the bus printed circuit board comprises third traces that route the communication signals to the third set of exposed pads on the surface of the bus printed circuit board, and wherein the bus printed circuit board also comprises notches for receiving an electronic device;
a set of one or more drivers, wherein each of the set of one or more drivers comprises hook-shaped snaps engaging the notches of the bus printed circuit board in order to mechanically mount the driver to the bus printed circuit board, wherein each of the set of one or more drivers further comprises a first set of spring contacts engaging the first set of exposed pads of the bus printed circuit board when the driver is mounted to the bus printed circuit board in order to supply the power from the external power source to the driver, wherein each of the set of one or more drivers further comprises a second set of spring contacts engaging the second set of exposed pads of the bus printed circuit board when the driver is mounted to the bus printed circuit board, wherein each of the set of one or more drivers further comprises a third set of spring contacts engaging the third set of exposed pads of the bus printed circuit board when the driver is mounted to the printed circuit board to connect the communication signals to the driver, and wherein each of the set of one or more drivers are programmable drivers configured to be programmable with configuration information specifying at least one behavior or setting of the light fixture; and
one or more light sources driven by the one or more drivers,
wherein the bus printed circuit board comprises second traces that route power output from the driver, via the second set of spring contacts and second set of exposed pads, to at least one of the light sources.

2. The lighting fixture of claim 1, wherein the bus printed circuit board and the one or more drivers are configured to snap together via the hook-shaped snaps and the notches.

3. The lighting fixture of claim 1, wherein at least one of the one or more drivers further comprises detection circuitry configured to detect a loss of power in the communication signals, and wherein the respective driver is configured to revert to a specified emergency behavior when a loss of power in the communication signals is detected.

4. The lighting fixture of claim 1, wherein the lighting fixture is configured to be suspended from a ceiling, and includes multiple light sources, at least one of the light sources positioned to direct light downward when the lighting fixture is suspended from a ceiling, and at least one of the light sources positioned to direct light upward when the lighting fixture is suspended from a ceiling.

5. The lighting fixture of claim 4, further comprising at least one light guide plate, wherein the at least one light source positioned to direct light downward when the lighting fixture is suspended from a ceiling comprises light emitting diodes (LEDs) that direct their light into the at least one light guide plate.

6. The lighting fixture of claim 5, wherein a top surface of the at least one light guide plate comprises extraction features configured to redirect light from the at least one light source positioned to direct light downward out of a bottom of the light guide plate.

7. The lighting fixture of claim 6, further comprising a reflector positioned above the top surface of the at least one light guide plate, wherein the reflector is configured to redirect any light from the at least one light source positioned to direct light downward which is redirected upward by the extraction features of the at least one guide plate.

8. The lighting fixture of claim 4, further comprising at least one lens, wherein the at least one light source positioned to direct light upward when the lighting fixture is suspended from a ceiling comprises light emitting diodes (LEDs) that direct their light into the at least one lens.

9. The lighting fixture of claim 1, wherein the at least one light source comprises light emitting diodes (LEDs) mounted to at least one LED printed circuit board separate from the bus printed circuit board.

10. The lighting fixture of claim 9, further comprising a fire-protective enclosure, wherein the bus printed circuit board and the one or more drivers are housed inside the fire-protective enclosure, and the at least one LED printed circuit board is disposed outside of the fire-protective enclosure.

11. The lighting fixture of claim 10, further comprising current-limiting circuitry separate from the one or more drivers and also housed inside the fire-protective enclosure.

12. The lighting fixture of claim 1, comprising at least two drivers each having at least two independent driving channels.

13. The lighting fixture of claim 12, wherein independent driving channels are configurable to cause different portions of the lighting fixture to emit light of different colors.

14. The lighting fixture of claim 12, wherein independent driving channels are configurable to cause different portions of the lighting fixture to emit light of different brightnesses.

15. The lighting fixture of claim 1, comprising a second bus printed circuit board, a jumper board, and at least two edge card connectors, the jumper board and edge card connectors connecting the two bus printed circuit boards together end-to-end.

16. The lighting fixture of claim 1, comprising a second bus printed circuit board and wiring electrically connecting the two bus printed circuit boards.

* * * * *